United States Patent [19]

Lur

[11] Patent Number: 5,395,790
[45] Date of Patent: Mar. 7, 1995

[54] STRESS-FREE ISOLATION LAYER

[75] Inventor: Water Lur, Taipei, Taiwan, Prov. of China

[73] Assignee: United Microelectronics Corp., Hsinchu, Taiwan, Prov. of China

[21] Appl. No.: 241,200

[22] Filed: May 11, 1994

[51] Int. Cl.⁶ .......................................... H01L 21/76
[52] U.S. Cl. .................................... 437/69; 437/70; 437/72; 437/73; 437/67; 148/DIG. 50
[58] Field of Search ................... 437/69, 70, 72, 73, 437/67; 148/DIG. 50

[56] References Cited

U.S. PATENT DOCUMENTS

| | | | |
|---|---|---|---|
| 4,211,582 | 7/1980 | Horng et al. | 437/67 |
| 5,204,280 | 4/1993 | Dhong et al. | 437/52 |
| 5,292,689 | 3/1994 | Cronin et al. | 437/67 |
| 5,308,786 | 5/1994 | Lur et al. | 437/63 |

FOREIGN PATENT DOCUMENTS

| | | | |
|---|---|---|---|
| 0245538 | 11/1987 | European Pat. Off. | 437/67 |
| 0113343 | 9/1980 | Japan | 437/72 |
| 0094646 | 7/1981 | Japan | 437/72 |
| 0255040 | 11/1986 | Japan | 437/72 |
| 0235160 | 9/1993 | Japan | 437/69 |

Primary Examiner—Brian E. Hearn
Assistant Examiner—Trung Dang
Attorney, Agent, or Firm—Ladas & Parry

[57] ABSTRACT

A method of fabricating a stress-free isolation layer for semiconductor integrated circuit that solves the problems of crystalline defects and the degraded characteristics of devices due to the presence of structural stresses. Partial trench etching is employed to form at least one narrow trenches, followed by anneal-treating to release stress and eliminate crystalline defects therein. Isolating material is then filled into the narrow trenches to form a complete stress-free isolation layer.

12 Claims, 4 Drawing Sheets

STRESS-FREE ISOLATION LAYER

BACKGROUND OF THE INVENTION

1. Field of the Invention

The present invention relates in general to isolation techniques for semiconductor integrated circuit devices and more particularly to methods of fabricating a stress-free isolation layer for components in semiconductor integrated circuit devices.

2. Technical Background

The continuous trend of miniaturization of semiconductor devices has driven the size of integrated circuits devices into the sub-micron level. For example, more than one million components have been squeezed into a die area of less than one centimeter square for memory devices. On a chip having this level of component density, adequate isolation between neighboring components must be secured to ensure acceptable device operating characteristics. The fabrication techniques necessary for such severe isolation requirement are generally referred to as isolation techniques. The primary purpose of isolation techniques is to maintain proper isolation between components on the same chip even as the space allowed for isolation decreases because as many components as possible are placed on the chip.

In the prior art, one widely employed technique for device isolation in semiconductor chips is a technique termed "local oxidation of silicon" (also known as "LOCOS"). A thick layer of silicon dioxide formed on the chip serves the purpose of isolation to achieve effective isolation between neighboring components on a semiconductor chip. FIGS. 1A to 1E of the drawings show, cross sectional views, a typical device manufactured using LOCOS in various process stages of fabrication.

Referring to FIG. 1A, a pad oxide layer 11 and a silicon nitride layer 12 are formed subsequently on a silicon substrate 10. Microlithography and etching processes are then utilized to define required patterns on the silicon nitride layer 12, followed by an ion implantation procedure to implant impurities in the area of the silicon substrate 10 not been covered by the silicon nitride layer 12. A channel-stop layer 13 (as shown in FIG. 1B) is thus formed.

In the process stage depicted by FIG. 1C, thermal oxidation has been accomplished to form a thick layer of field oxide 14. Due to the fact that the oxidation rate of silicon nitride is much smaller than that of silicon, the oxidation resistant silicon nitride layer 12 can be utilized as a shielding mask in the oxidation process, so that oxidation only takes place effectively in the areas of the silicon substrate 10 which have not been covered by the silicon nitride layer 12. The formed oxidized layer is the field oxide layer 14. Since the oxidized layer occupies more volume than the silicon used to form the layer, stress within the crystalline structure forms crystalline defects 16. Referring to FIG. 1D, the silicon nitride layer 12 is then removed to obtain a silicon nitride layer free configuration. Devices with acceptable isolation from each other can then be fabricated on the chip in the regions between field oxide layers 14.

The above described prior art local oxidation or LOCOS technique suffers several drawbacks when applied to fabrication of devices having sub-micron features. First, during the process of forming the field oxide layer 14, the oxidation not only takes place in the direction vertical to the major plane of the silicon substrate 10 but also extends in a horizontal direction. Layer 14 therefore expands into the region under the silicon nitride layer 12. Consequently, the silicon nitride layer 12 is lifted upwards. The effect is commonly called the "birds beak" effect.

Second, the bird's beak effect results, in turn, in compression stress in the region near the surface of silicon nitride layer 12, forcing the nitrogen-like material to diffuse into the neighboring underlying tensile-stressed pad oxide layer. The diffused nitrogen reacts with the silicon substrate 10 to form a type of nitride-like layer 15. Because of the resistance of the nitride-like layer 15 to oxidation, this nitride-like layer 15 obstructs the subsequent growing of a gate oxide layer, acting essentially as a mask, in subsequent device fabrication procedures. As a result, the thickness in the gate oxide layer is reduced. The resulting phenomena is referred to as the "white ribbon" effect, so named because, through an optical microscope, it is observed as the apparent presence of white ribbon in the perimeter of active areas on the silicon substrate.

Third, there is a 2.2 fold volume expansion when silicon is oxidized into silicon dioxide. Therefore, the field oxide layer 14 protrudes above the surface of the silicon substrate 10, forming a non-recessed surface.

Fourth, the channel-stop layer 13 tends to expand laterally under the influence of the high temperature and long time thermal treatment during the formation of the field oxide layer 14, thereby narrowing the active area width. This is disadvantageous for the scaling-down of VLSI circuits.

Fifth, due to the lateral volumetric expansion of silicon during the formation of field oxide layer 14, massive stresses result in the active area that produce crystalline defects in the bird beak regions. The crystalline defects cause an increase in junction leakage and a reduction in the reliability of the semiconductor device.

Accordingly, many new processes have been developed to overcome these drawbacks in forming isolation regions. For example, in one process, silicon dioxide sidewall spacers are formed before the formation of the field oxide layer. This is to prevent the lateral diffusion of the oxygen atoms that form the bird's beak into the silicon substrate.

Regarding the problem of the white ribbon effect, the prior art method had utilized the formation of an oxide layer on the surface of the active area. This layer and the nitride-like layer 15, is then etched away to reveal again the surface of the device. The resulting configuration (as shown in FIG. 1E) has a field oxide layer 14 that is partially etched away together with the nitride-like layer 15, and is reduced in its overall thickness.

In another process buffering polysilicon (not shown) is applied between the pad oxide layer 11 and the silicon nitride layer 12, so as to release the local stresses and minimize the amount of nitrogen diffused away. The small amount of diffused nitrogen can form a nitride-like layer in the interface between the polysilicon layer and the pad oxide layer 11, in order to prevent the formation of white ribbons at the perimeter of active area on the silicon substrate 10.

The top surface of a chip is preferably planar. To accomplish this a pre-etching scheme has been proposed. First, a shallow trench is formed to the depth of 2,000 to 3,000Å, then it is filled with the field oxide layer to obtain a recessed structure.

Narrowing of the active area width caused by lateral diffusion of channel-stops during high-temperature treatment is undesirable. Therefore, a method the field oxide layer is formed before the channel-stop layer, thereby preventing the diffusion caused by high temperature during the process stage.

The formation of crystalline defects caused by the bird's beak should be avoided. A sidewall protecting layer helps relieve this stress, but there are still massive stresses caused by the volumetric expansion which occurs during the formation of the field oxide layer.

SUMMARY OF THE INVENTION

It is therefore an object of the present invention to provide a method of fabricating stress-free isolation layer in the semiconductor integrated circuit to prevent the bird's beak effect which is generated in the formation of the field oxide layer using the prior art LOCOS technique.

It is another object of the present invention to provide a method of fabricating stress-free isolation layer in a semiconductor integrated circuit to prevent the white ribbon effect generated at the periphery of the isolating field oxide regions.

It is still another object of the present invention to provide a method of fabricating a stress-free isolation layer in a semiconductor integrated circuit to obtain a recessed field oxide layer.

It is still another object of the present invention to provide a method of fabricating a stress-free isolation layer in a semiconductor integrated circuit while inhibiting narrowing of active area.

In accordance with the above objects, this invention employs a novel self-aligned partial trench etching of the field oxide followed by a moderate thermal treatment to release the stress therein. With the internal stress released substantially, the occurrences of crystalline defects are reduced.

These and other objects of the invention are accomplished by a method of fabricating a stress-free isolation layer for semiconductor integrated circuits comprising the steps of:

(a) providing a silicon substrate;

(b) forming, sequentially, a) a pad oxide layer, b) a polysilicon layer, and c) a silicon nitride layer on said silicon substrate;

(c) etching the layered silicon substrate to expose at least one shallow trench in said silicon substrate;

(d) forming sidewall spacer nitride layers on side walls of said shallow trench in said silicon substrate;

(e) forming a field oxide layer that fills said shallow trench;

(f) etching designated areas of said field oxide layer to form at least one narrow trench in said field oxide layer;

(g) selectively ion implanting impurities through said at least one narrow trench into said silicon substrate;

(h) annealing said silicon substrate to release aystem stress;

(i) depositing an insulating layer to fill said at least one narrow trench in said field oxide layer to form the isolation layer; and (j) stripping said silicon nitride layer, said polysilicon layer, and said pad oxide layer.

BRIEF DESCRIPTION OF THE DRAWING

Other objects, features and advantages of the present invention will become apparent by way of the following detailed description of the preferred, but non-limiting embodiment, with reference to the accompanied drawings, wherein.

DETAILED DESCRIPTION OF THE PREFERRED EMBODIMENT

Figure 1A:
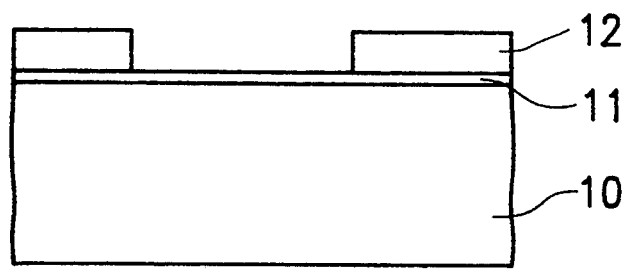
FIGS. 1A-1E show a cross sectional view of the same part of a typical semiconductor integrated circuit device taken after different steps during in the fabrication process, to show the effect of employing the prior art technique of local oxidation of silicon.
Figure 1B:
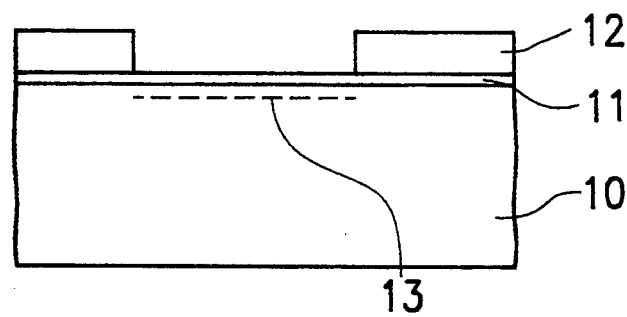
Figure 1C:
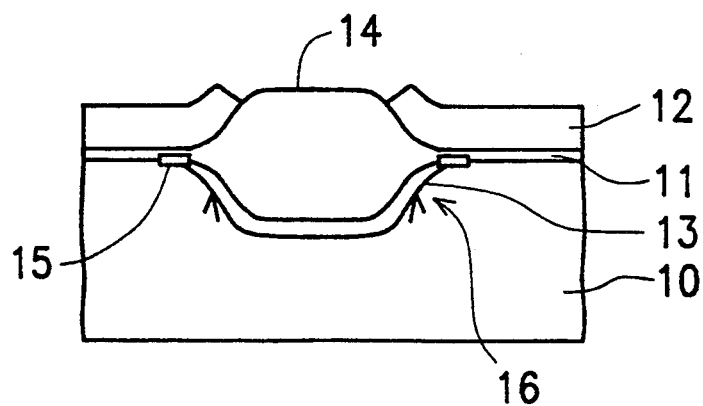
Figure 1D:
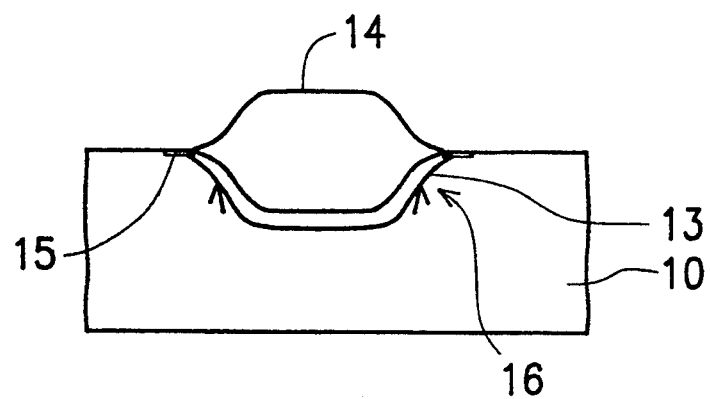
Figure 1E:
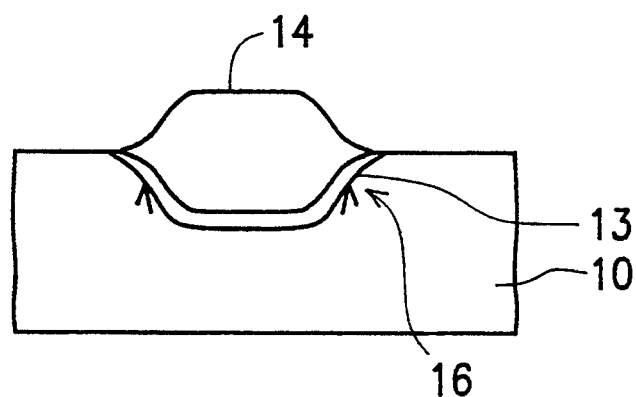
Figure 2A:
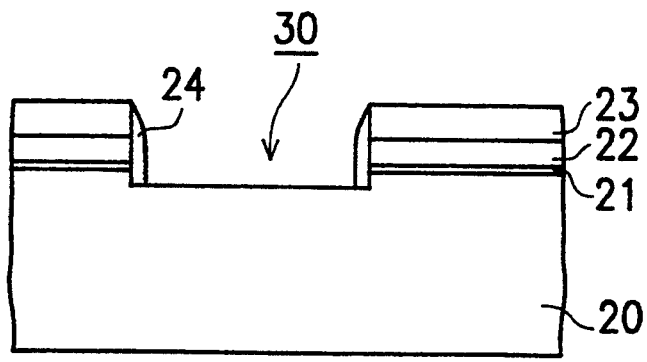
FIGS. 2A-2E show a cross sectional view of the same part of a semiconductor integrated circuit device, taken after different steps during the fabrication process in this invention.

Referring now to FIG. 2A, a thermal oxidation process is conducted on a silicon substrate 20 to form a relatively thin pad oxide layer 21 having a thickness in the range of 80 to 500Å. A polysilicon layer 22 with a thickness in the range of 100 to 2,000Å, and a nitride layer 23 with a thickness in the range of 500 to 3,000Å, are then sequentially formed on top of the pad oxide layer 21 by conventional methods, for example, by chemical vapor deposition (CVD). Microlithography and etching, such as reactive ion etching (RIE) processes, are then utilized to etch the nitride layer 23, polysilicon layer 22, and pad oxide layer 21, so as to reveal an opening to the silicon substrate 20. Further etching into the silicon substrate 20 in the revealed opening forms a shallow trench 30, having a depth in the range of 1,000 to 3,000Å. Afterwards, a spacer nitride layer 24 with thickness of 100 to 1000Å is formed on each side wall of the shallow trench 30.

Figure 2B:
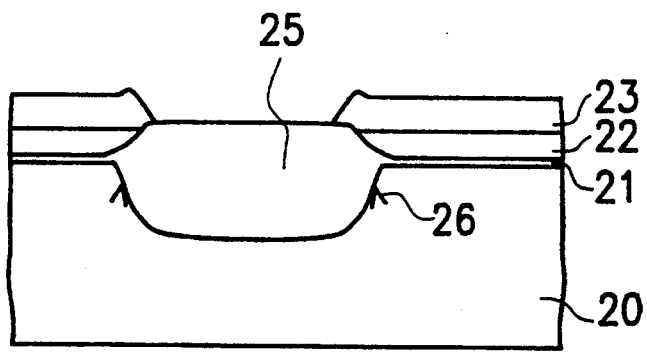

Referring now to FIG. 2B, oxygen gas, at a temperature of between about 800° and 1100° C., is passed over the device to react for an extended period of time, preferably for a period of time between about 60 seconds and about 20 hours, thereby forming a field oxide layer 25 with a thickness in the range of 3,000 to 8,000Å. Because of the presence of the spacer nitride layer 24, the bird's beak effect is significantly reduced. However, certain defects 26 in the crystalline structure form in the silicon substrate.

Figure 2C:
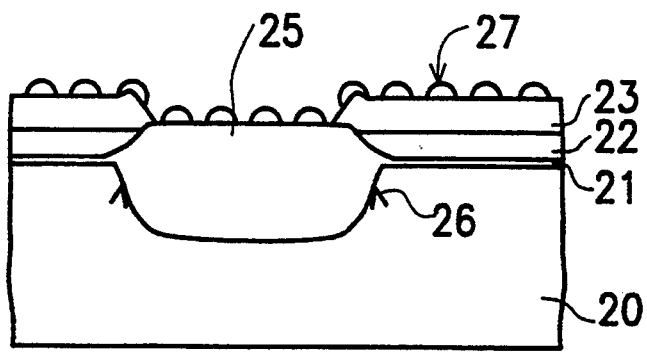

Referring now to FIG. 2C, a metal alloy layer (not shown) is deposited on the top surface of the device by sputtering at temperature higher than 300° C. or post-annealing the sputtered metal layer at temperature higher than 300° C. The composition of the metal applied by sputtering is, for example, an alloy of aluminum containing between about 1 and 4 wt % silicon, and preferably containing about 2 wt % silicon. The thickness of the layer is in the range of about 5,000 to 20,000Å.

The solubility of silicon in aluminum is extremely low (and aluminum also has a low solubility in silicon) in the room temperature range. Therefore, after sputtering or post-annealing, many silicon nodules precipitate in the metal layer, especially at the aluminum grain boundaries and interface between metal layer and underlayer.

The deposited metal alloy layer is then subjected to a reactive ion etching process to remove the aluminum and which thereby reveals the aforementioned silicon nodules 27. Those nodules have sizes between 0.05 to 0.3 $\mu$m (500 to 3,000Å) and are uniformly distributed over the surface of the device.

Figure 2D:
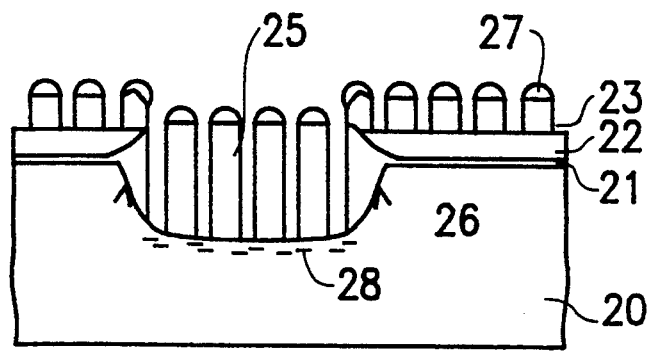

Referring to FIG. 2D, the silicon nodules 27 are used as the mask and the polysilicon layer 22 is used as the etching-stop layer. Then the device under fabrication is subjected to an anisotropic etch with chemicals of $CHF_4$, $O_2$, or the like, to obtain narrow trenches in the field oxide layer 25. The addition of $O_2$ to $CHF_4$ in a plasma etch causes SiO$_2$ to etch preferentially compared to Si.

The silicon substrate 20 can be doped with impurities that pass through the narrow trenches to form the channel-stop layer 28.

The device under fabrication is then subjected to a short (about 5 to 20 minutes) heat treatment at 850° C. to 950° C. in an oxygen-free environment, for example, in a helium or an argon atmosphere, or in an environment containing very little oxygen, to release the stress around the field oxide layer 25, and eliminating most, preferably all, of the crystalline defects 26. Meanwhile, the implanted impurities in the channel-stop layer are also electrically activated and re-distributed to form an even layer.

Figure 2E:
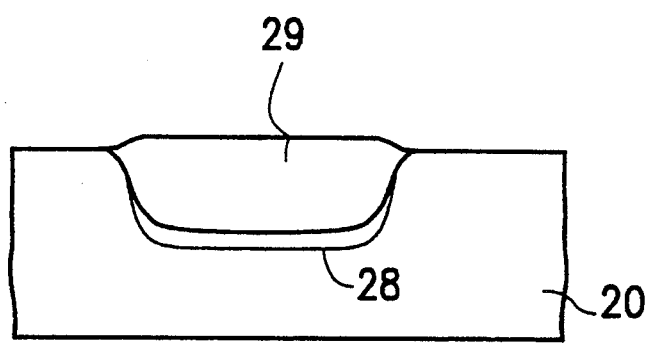

Referring now to FIG. 2E, an insulating layer, such as silicon dioxide, polyimide, borophosphosilicate (BPSG) or the like, is deposited by, for example, CVD. All the narrow trenches within the field oxide layer 25 are filled, and a stress-free isolation layer 29 is obtained. Conventional procedures are then applied to sequentially strip off the nitride layer 23, polysilicon layer 22 and pad oxide layer 21, respectively. The silicon nodules 27 are also removed by this etch. For example, first the nitride layer is stripped using a conventional hot H$_3$PO$_4$ solution. Then the polysilicon layers are stripped by using a conventional KOH solution, or by using reactive ion etching. Finally, for stripping pad oxide, the device under fabrication is typically bathed in a solution containing HF. The device isolation is completed after these stripping steps.

Having described the invention in connection with a preferred embodiment, modification will now suggest itself to those skilled in the art. Thus the invention is not to be limited to the disclosed embodiment, except as required by the appended claims.

I claim:

1. A method of fabricating a stress-free isolation layer for semiconductor integrated circuits comprising the steps of:
   (a) providing a silicon substrate;
   (b) forming, sequentially, a) a pad oxide layer, b) a polysilicon layer, and c) a silicon nitride layer on said silicon substrate;
   (c) etching said silicon nitride layer, said polysilicon layer, and said pad oxide layer to expose predetermined areas of said silicon substrate;
   (d) etching said pre-determined areas of said silicon substrate to form at least one shallow trench;
   (e) forming sidewall spacer nitride layers on side walls of said shallow trench in said silicon substrate;
   (f) forming a field oxide layer that fills said shallow trench;
   (g) etching designated areas of said field oxide layer to form at least one narrow trench in said field oxide layer;
   (h) selectively ion implanting impurities through said at least one narrow trench into said silicon substrate;
   (i) annealing said silicon substrate to release system stress, and to form a channel-stop layer in said silicon substrate;
   (j) depositing an insulating layer to fill said at least one narrow trench in said field oxide layer to form the isolation layer; and
   (k) stripping said silicon nitride layer, said polysilicon layer, and said pad oxide layer.

2. The method of claim 1 wherein the thickness of said pad oxide layer in step (b) is in the range of 80 to 500Å.

3. The method of claim 1 wherein the thickness of said polysilicon layer in step (b) is in the range of 100 to 2,000Å.

4. The method of claim 1 wherein the thickness of said silicon nitride layer in step (b) is in the range of 500 to 3,000Å.

5. The method of claim 1 wherein the depth of said at least one shallow trench in said silicon substrate in step (d) is in the range of 1,000 to 3,000Å.

6. The method of claim 1 wherein the thickness of said spacer nitride layer in step (e) is in the range of 100 to 1000Å.

7. The method of claim 1 wherein said step (g) further comprises the following steps:
   (g1) forming a hot metal-silicon alloy layer with a thickness in the range of 5,000 to 20,000Å on the exposed surface of said field oxide layer and said silicon nitride layer and allowing the alloy layer to cool;
   (g2) etching said metal alloy layer thereby forming a plurality of silicon nodules having sizes in the range of 500 to 3,000Å.
   (g3) etching said filed oxide layer by utilizing said silicon nodules as mask and said polysilicon as etching-stop layer to form at least one narrow trench in said field oxide layer.

8. The method of claim 1 wherein the insulating layer in step (j) is a silicon dioxide layer.

9. The method of claim 1 wherein the insulating layer in step (j) is a polyimide layer.

10. The method of claim 1 wherein the insulating layer in step (j) is a BPSG layer.

11. The method of claim 7 wherein said metal alloy layer is aluminum-silicon alloy.

12. The method of claim 11 wherein the silicon content of the alloy is in the range of 1 to 4%.

* * * * *